United States Patent [19]

Stehlin et al.

[11] 4,054,899
[45] Oct. 18, 1977

[54] PROCESS FOR FABRICATING MONOLITHIC CIRCUITS HAVING MATCHED COMPLEMENTARY TRANSISTORS AND PRODUCT

[75] Inventors: Robert A. Stehlin, Richardson; William F. Cashion, Dallas, both of Tex.

[73] Assignee: Texas Instruments Incorporated, Dallas, Tex.

[21] Appl. No.: 69,292

[22] Filed: Sept. 3, 1970

[51] Int. Cl.² .................. H01L 27/02; H01L 27/04; H01L 29/72; H01L 7/36
[52] U.S. Cl. .................................. 357/44; 357/48; 357/34
[58] Field of Search ............... 317/235, 22.1, 48.9; 148/191; 357/44, 48, 34

[56] References Cited

U.S. PATENT DOCUMENTS

| 3,327,182 | 6/1967  | Kisinko ............... 317/235 |
| 3,465,215 | 9/1969  | Bohannon et al. ...... 317/235 |
| 3,481,801 | 12/1969 | Hugle ................. 317/235 |
| 3,502,951 | 3/1970  | Hunts ................. 317/235 |
| 3,617,827 | 3/1970  | Schmitz .............. 317/235 |

FOREIGN PATENT DOCUMENTS

| 1,541,490 | 8/1968  | France .............. 317/235 |
| 1,926,884 | 12/1969 | Germany ............. 317/235 |

*Primary Examiner*—Edward J. Wojciechowicz
*Attorney, Agent, or Firm*—Harold Levine; James T. Comfort; Gary C. Honeycutt

[57] ABSTRACT

A process for fabricating a monolithic integrated circuit having matched semiconductor devices and P-N junction isolation regions, with the collector regions for the semiconductor devices of one polarity type and the isolation regions being formed by up-diffusing impurities from a selected surface of a substrate of one conductivity type though an epitaxial layer of opposite conductivity type formed thereon, so that such collector regions are surrounded by material of opposite conductivity type, and the P-N junction isolation regions selectively isolate semiconductor devices of opposite polarity type from other circuit elements, wherein such collector regions and P-N junction isolation regions have retrograded impurity concentration profiles.

14 Claims, 10 Drawing Figures

PROCESS FOR FABRICATING MONOLITHIC CIRCUITS HAVING MATCHED COMPLEMENTARY TRANSISTORS AND PRODUCT

BRIEF DESCRIPTION OF INVENTION AND BACKGROUND INFORMATION

This invention relates generally to semiconductor devices, and more particularly to the fabrication of monolithic circuits having matched complementary bipolar transistors, with one polarity type transistor having self-isolating characteristics and the other polarity type being selectively isolated from other circuit elements by circumscribing P-N junction isolation regions.

In the fabrication of complete functional circuits in monolithic form, both NPN and PNP transistors and semiconductor diodes, capacitors, and resistors can be formed on the same semiconductor substrate by various combinations of the same diffusion steps. Since yields tend to decrease exponentially with an increase in the number of diffusion steps in any particular fabrication process, it is advantageous to minimize the diffusion steps required to form the circuit components. If an integrated circuit uses only one type of transistor, only three diffusions are typically used, whereas if both NPN and PNP transistors, as well as other semiconductor devices, are required for the circuit, it is generally necessary to make at least four diffusions. A number of techniques have been devised which utilize an even larger number of diffusion steps, particularly when the NPN and PNP transistors must have matched operational parameters.

The prior art is replete with processes and techniques utilized to produce monolithic integrated circuits having both PNP and NPN transistors on the same substrate. In one known process, the PNP transistors are formed by utilizing the base and collector diffusions of the NPN transistors and the p-type substrate. However, the use of the same diffusion to form different components must necessarily result in the trade off of desirable operational parameters between the NPN and PNP devices. As a general rule, when a p-type substrate is used, the PNP transistor is of low quality and when an n-type substrate is used, the NPN device is of low quality. In other known processes of this type, additional diffusion cycles are used to improve the electrical characteristics of the PNP transistor. Some of these prior known processes and techniques are described in a publication entitled "Designing A Micro Electronic Differential Amplifier", Electron Products, pages 34–37, July, 1962; and in a publication entitled "Low Power Integrated Circuits", Westcon Electronics Show and Convention, 1965,; Session 1; and in a publication entitled "Lateral Complementary Transistor Structure for the Simultaneous Fabrication of Functional Blocks", Proceedings of the IEEE, Pages 1491–1495, December, 1964.

Another known example of a monolithic integrated circuit having complementary transistors formed therein can be found in U.S. Pat. No. 3,327,182 entitled "Semiconductor Integrated Circuit Structure and Method of Making the Same" issued to Paul M. Kisinko on June 20, 1967. This patent discloses a technique for fabricating a structure that includes transistors of both polarities of which one is formed by triple diffusion but with an impurity concentration gradient in the collector region that is a maximum away from the base collector junction so that the base-collector junction break down voltage is increased typically to about 65 volts. In accordance with this patent, the collector region of the triple diffused transistor is formed by deposition of doping impurity material between epitaxially grown layers. Upon redistribution the diffused collector extends through the epitaxial layers and has its maximum impurity concentration away from the surface. Consequently, the impurity concentration in subsequently diffused operations need not be as high as in normal triple diffused structures and break down voltage is greater.

Other examples of known processes for producing monolithic integrated circuits having matched complementary transistors in the same semiconductor substrate can be found in U.S. Pat. No. 3,465,215, entitled "Process for Fabricating Monolithic Circuits Having Matched Complementary Transistors and Product", issued Sept. 2, 1969, to R. O. Bohannon, Jr. et al, and U.S. Pat. No. 3,474,309, entitled "Monolithic Circuit with High Q Capacitor", issued Oct. 21, 1969 to R. A. Stehlin, each assigned to the assignee of this application.

In general, the prior art processes and techniques for producing complementary transistors on a single substrate have yielded complementary transistors having characteristics that are satisfactory in many respects, but such processes are so complex as to not be suitable for mass production operations. In production runs the yields of good devices tend to decrease with the number of diffusion steps involved in the process.

In accordance with the fundamental objectives of this invention, a relatively simple process involving six diffusions, the first of which is non- critical, produces a monolithic integrated circuit having both NPN and PNP transistors with closely matched parameters of high values. In addition, all electrical components are electrically isolated from other electrical components.

In accordance with the present invention, a process for fabricating monolithic integrated circuits having matched complementary transistors is provided that includes the steps of diffusing a plurality of first regions of one conductivity type into a starting material of opposite conductivity type; selectively depositing impurity concentration second regions of the opposite conductivity type into some of the first regions and selectively circumscribing the remaining first regions; epitaxially depositing a material of the one conductivity type thereover and then to up-diffuse the second regions through the epitaxial layer until they surface to produce regions of the opposite conductivity type that have retrograded impurity concentration profiles. The retrograded second regions that extend from the first regions function as collector regions for the PNP transistors and are surrounded by material of the one conductivity type so as to provide self isolation for any semiconductor device formed therein; whereas the retrograded second regions that circumscribe the first regions function as diffused isolation regions to provide electrical isolation for any semiconductor device formed within such isolation regions from other circuit elements. Base and emitter regions may then be diffused into the retrograded second regions that extend from the first regions, and into the epitaxial material circumscribed by the retrograded isolation regions, to produce a monolithic integrated circuit having matched complementary transistors.

It is therefore one object of the present invention to provide a process for fabricating monolithic integrated circuits having matched complementary semiconductor devices of improved performance characteristics and control ability.

Another object of this invention is to provide a monolithic integrated circuit having matched complementary semiconductor devices in which up- diffused regions having retrograded impurity concentration profiles forming the collector regions for the transistors of one polarity type to produce self isolation capability.

Another object of this invention is to provide a monolithic integrated circuit having matched complementary semiconductor devices in which up-diffused regions having retrograded impurity concentrated profiles circumscribe the collector regions for transistors of one polarity type for electrically isolating such transistors from other circuit components.

Another object of this invention is to provide a monolithic integrated circuit having matched complementary semiconductor devices that is substantially simple in design and relatively inexpensive to manufacture.

These and other objects and features of this invention will readily be apparent from the following detailed description when taken in conjunction with the appended claims and attached drawings.

DETAILED DESCRIPTION

Figure 1:
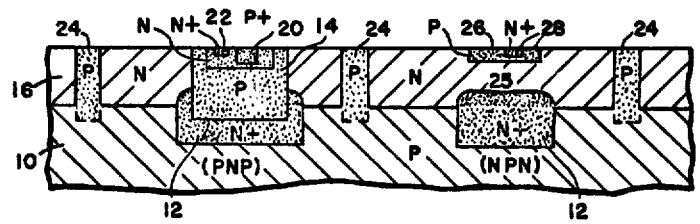
FIG. 1 is a cross-sectional view of a monolithic integrated circuit having matched complementary transistors in accordance with the present invention.
Figure 2:
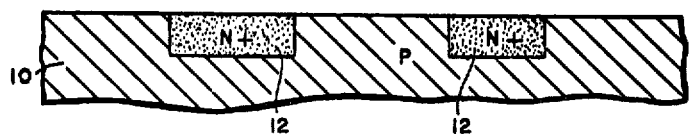
FIGS. 2–6 are cross-sectional views of the monolithic integrated circuit of FIG. 1 successively illustrating various steps in the process of fabricating such circuit in accordance with the present invention.
Figure 3:
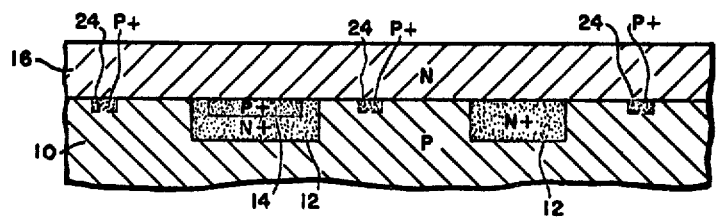
Figure 4:
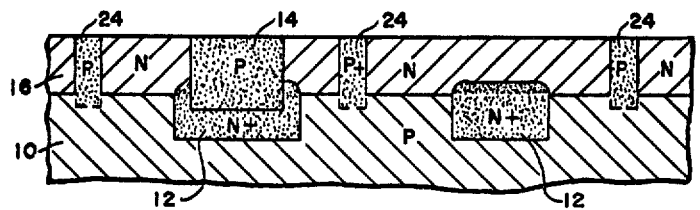
Figure 5:
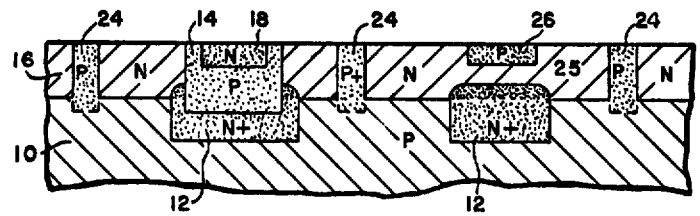
Figure 6:
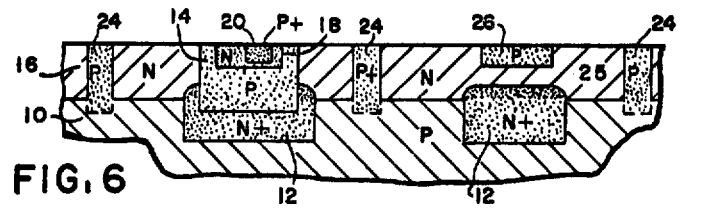

A detailed description of several embodiments of this invention follows with reference being made to the drawings wherein like parts have been given like reference numerals for clarity and understanding of the elements and features of this invention.

Referring to FIGS. 1–6, there is generally shown successive steps in a process for fabricating a monolithic integrated circuit having bi-polar transistors formed therein wherein the up-diffused p-type collector region 14 of the PNP transistor extends from an n-type buried layer 12 formed within a p-type semiconductor substrate 10, up and through an n-type epitaxial layer 16, with its lower portion that is within the buried layer 12 being surrounded by material of opposite conductivity type (N+) while its upper portion that is within the epitaxial layer 16 is also surrounded by material of opposite conductivity type (N). Up-diffused isolation regions 24, which also extend from the substrate up and through the n-type epitaxial layer 16, circumscribe selected n-type buried layers 12 formed within the substrate 10 to define the collector region 25 for the NPN transistor. By this construction, the PNP transistor that is formed within the up-diffused region 14 is advantageously self-isolated from other circuit elements, while the NPN transistor that is formed within the epitaxial layer defined by the up-diffused isolation region 24 is also electrically isolated from other circuit elements.

The monolithic integrated circuit as shown in FIG. 1 may be fabricated in accordance with the following process:

1. The starting material is a p-type silicon substrate 10 preferably having a resistivity of 10–15 ohm-centimeters and a typical thickness of approximately 0.010 inches.

2. A plurality of N+ type high concentration regions 12 are selectively diffused into the substrate 10. Antimony may be used as the N+ type dopant. In this step of the process the structure is maintained at a temperature of about 800° C for about 5 minutes, preceded and followed by 5 minute nitrogen purges. A sheet resistance of about 150–160 ohms per square results after the deglazing step. The antimony is then diffused at about 1300° C using a 10 minute oxygen purge, followed by 20 minutes in a steam atmosphere and 24 hours in a nitrogen atmosphere. At this point, the sheet resistance is about 0.1 ohms per square, the depth of the diffusion is about 20 microns and the surface concentration of the diffused regions 12 is about $1 \times 10^{18}$ atoms/cc.

3. A plurality of P+ type high concentration impurity regions 14 are selectively deposited into some of the N+ regions 12, and at the same time a plurality of P+ type high concentration impurity regions 24 are selectively deposited into the substrate 10 so as to selectively circumscribe some of the N+ regions 12. This deposition step may be made by first placing the structure in a deposition furnace, heating the substrate to about 975° C, purging the deposition chamber with oxygen for about 5 minutes, passing a conventional reacting stream containing boron tribromide(BBr$_3$) through the deposition chamber for about 20 minutes, and then purging the chamber with nitrogen for another five minutes. The structure is then subjected to a conventional deglaze step. The deposited regions 14, 24 have a surface concentration of about $2 \times 10^{20}$ atoms/cc, a sheet resistance of about 40 ohms per square.

4. An n-type layer 16 is then epitaxially deposited onto the substrate 10 and over the diffused regions 12 and deposited regions 14 and 24 by conventional epitaxial deposition techniques. The epitaxial layer 16 may be n-type silicon doped with phosphorous, antimony or arsenic having a resistivity of about 0.2 ohm-centimeters and being about 5 microns thick.

5. The structure is then placed into a conventional diffusion furnace wherein up-diffused regions 14 are formed to produce collector regions for the PNP transistors, and up-diffused regions 24 are formed to produce isolation regions for the NPN transistors. Both the up-diffused collector regions 14 and the up-diffused isolation regions 24 have retrograded impurity concentration profiles (See FIGS. 7 and 8). This diffusion step may be made by placing the structure in a diffusion furnace where it is heated to about 1250° C while the diffusion furnace is first purged with oxygen for about five minutes, then filled with steam for about 30 minutes, then purged with nitrogen for about five hours. Concentration at the surface resulting from the up-diffusion of the collector regions 14 and isolation regions 24 is about $2 \times 10^{17}$ atoms per cc. The isolation regions 24 extend downwardly into the underlying substrate 10 as a result of down diffusion, and extend upwardly and substantially through the epitaxial layer 16 due to up-diffusion. The collector region extends into its respective underlying buried region 12 due to down diffusion and extend upwardly and substantially through the epitaxial layer 16 due to up-diffusion. The resulting sheet resistance of both the collector regions 12 and the isolation regions 24 is approximately 70 ohms per square, but may vary.

6. Heavily doped n-type regions 18 are then respectively diffused into the retrograded collector regions 14 to produce the base regions of the PNP transistors. The surface concentration of the base regions 18 is kept as low as possible and yet achieve the desired depth for the collector-base junction. Phosphorous is preferably used as the n-type dopant and is deposited from phosphorous oxytricloride (POCL$_3$) at a structure temperature of about 780° C. The deposition period is about 25 minutes, preceding and followed by 5 minute nitrogen purges. After a deglazing step, the sheet resistance is about 180–200 ohms per square. The phosphorous introduced is then diffused at 1200° C using a 10 minute oxygen purge, followed by 20 minutes in a steam atmosphere and 60 minutes in a nitrogen atmosphere. At this point the sheet resistance is about 50 ohms per square, and the depth of the diffusion is about 1.6 microns and the surface concentration of the diffused region 18 is about $1 \times 10^{19}$ atoms/cc.

7. Heavily doped p-type region 26 is then respectively deposited and diffused into the epitaxial layer 16 that is defined by the isolation regions 24, so as to overlie respective buried regions 12 to produce the base regions of the NPN transistors. The deposition step may be done by boron deposition from boron tribromide (BBr$_3$) and may be carried out at a structure temperature of about 950° C for a period of about 8 minutes, preceding and followed by 2 minute purge periods. The structure is then diffused at 1150° C, using a 30 minute steam atmosphere, preceded and followed by 5 minute purge periods. The impurity concentration at the surface is about $8 \times 10^{18}$ atoms/cc, with a junction depth of about 1.6 microns.

8. Heavily doped p+ regions 20 are then respectively diffused into the base regions 18 to produce the emitter regions for the PNP transistors. This may again be a boron deposition from boron tribromide (BBr$_3$), and may be carried out at structure temperature of about 1100° C for a period of about 8 minutes, preceding and followed by a 2 minute purge period. The impurity concentration at the surface is about $4 \times 10^{20}$ atom/cc, and the junction depth is about 1.3 microns. Since substantially no oxide layer is grown during the low temperature diffusion of the emitter regions 20, the structure is then covered with a layer of oxide deposited by the thermal decomposition of tetraethyl-orthosilane or other suitable oxide deposition techniques to cover the windows through which the emitter diffusion 20 was made.

9. Heavily doped N+ type regions 22 are then respectively diffused into the base region 18 to produce the base contact region for the PNP transistor, and at the same time heavily doped N+ regions 28 are respectively diffused into the base regions 26 to produce the emitter regions 28 for the NPN transistor. This deposition preferably is done from phosphorous oxide trichloride (POCL$_3$) at a structure temperature of about 1000° C for 8 minutes, preceded and followed by 2 minute purge periods. A surface concentration of the final diffusion is about $1 \times 10^{21}$ atom/cc, and the diffusion depth is about 0.5 microns. Again, the structure is coated with a suitable deposited oxide. This step in the process is optional depending upon the impurity concentration at the surface of the base region 18.

Therefore, the retrograded p-type region 14 functions as the collector region for the PNP transistor; the diffused n-type region 18 functions as the base region of the PNP transistor; and the P+ type diffused region 20 functions as the emitter region of the PNP transistors; and the N+ type diffused region 22 functions as the base contact region for the PNP transistor.

Also, the region of the N type epitaxial layer 16 bounded by the retrograded p-type isolation region 24 and overlying the N+ type buried region 12 functions as the collector region 25 of the NPN transistor; the p-type region 26 functions as the base region of the NPN transistor; and the N+ type region 28 functions as the emitter region of the NPN transistors.

Thus, PNP transistors fabricated in accordance with the process above set forth are self-isolated by virtue of the fact that their collector regions 14 are surrounded by semiconductor material of opposite conductivity, i.e., N+ type buried regions 12 and the n-type epitaxial layer 16; and NPN transistors fabricated in accordance with the above process are electrically isolated from other circuit components by the circumscribing p-type isolation regions 24. Conventional ohmically contacting metal conductors may be photolithographically or photochemically applied (not shown) to finalize the package and provide outside world connection.

Figure 7:
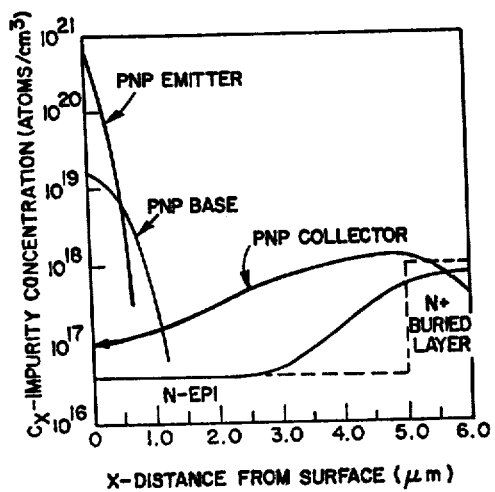
FIG. 7 is a graph depicting the approximate impurity concentration profile of a PNP transistor fabricated in a monolithic integrated circuit in accordance with the present invention.
Figure 8:
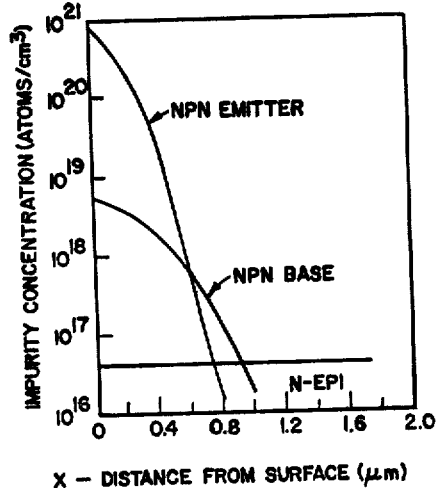
FIG. 8 is a graph depicting the approximate impurity concentration profile of an NPN transistor of a monolithic circuit fabricated in accordance with the present invention.
Figure 9:
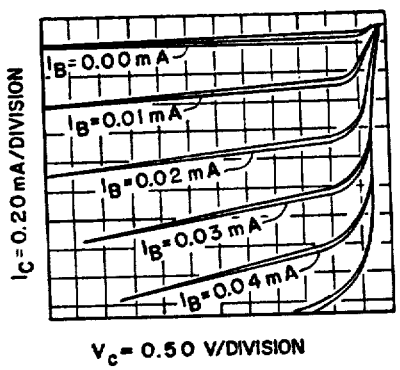
FIG. 9 is a graph illustrating the current-voltage characteristics of a PNP transistor of a monolithic integrated circuit fabricated in accordance with the present invention.
Figure 10:
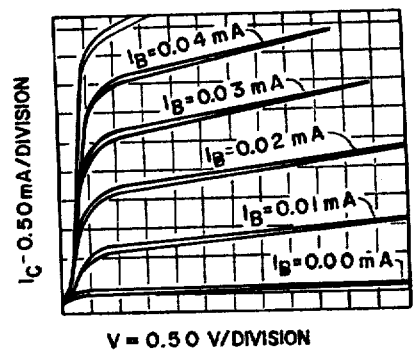
FIG. 10 is a graph illustrating the current-voltage characteristics of an NPN transistor of a monolithic integrated circuit fabricated in accordance with the present invention.

The final impurity profiles of the self-isolating PNP transistors and the isolated NPN transistors are respectively shown in FIGS. 7 and 8. The resulting PNP transistors have a $h_{FE}$ value of about 90–110 at low currents, while the NPN transistors have an $h_{FE}$ value of about 100–120 at low currents. The current voltage characteristics of the PNP and NPN transistors are respectively shown in FIGS. 9 and 10.

The above disclosed preferred embodiment of a process for fabricating a monolithic integrated circuit having matched complementary bi-polar transistors in accordance with this invention advantageously requires only six diffusion steps, and only 7 photolithographic steps. The diffusion step used to form the base region 26 of the NPN transistor provides a means for simultaneously forming resistors having sheet resistances from about 500 to about 600 ohms per square, thus making the very large resistance values required for micropower operation realizable within a practical area. Also, capacitors having high Q values and high capacitance per square area can also be formed by using the junction between the retrograded collector regions 14 and the buried layer 12 to form one junction of the capacitor, and the junction formed between the n-type base regions 18 and the retrograded collector regions 14 to form the other junction of the capacitor. Of course, it would be readily discernible from the above description in light of the attached drawings that other junctions can be desirably utilized for fabricating semiconductor diodes.

Thus, many of the necessary electrical components for monolithic integrated circuits can be readily fabricated utilizing the above six diffusion steps, yet all of the PNP transistors are advantageously self isolated, while all the NPN transistors, and other components, may be respectively disposed within the isolation regions 24 in the epitaxial layer 16 to readily provide PN junction isolation. Also, the buried regions 12 advantageously isolate the retrograded collector regions 14 of the PNP transistors from the p-type substrate 10, while the N+ buried regions 12 advantageously provide low resistivity paths for collector current to the NPN transistors. Furthermore, the temperature coefficient of the diffusion used to form the base regions 26, and any resistors (not shown), is sufficiently high to effectively compensate for changes in the base-emitter voltage of the transistors to provide more staple circuit operation.

In the circuit operation and performance of monolithic integrated circuits having bi-polar transistors, for example, it is highly advantageous to have regions with retrograded impurity concentration profiles functioning as the collector regions, for example, of such transistors. This retrograded feature is preferable because it provides decreased impurity concentration at the collector-base junction to produce increased breakdown voltages. Furthermore, such retrograded collector regions provide increased impurity concentration below the collector-base junction to produce decreased collector resistance.

It will therefore be apparent from the foregoing description of the present invention in light of the attached drawings that monolithic integrated circuits having matched complementary semiconductor devices may be efficiently and effectively produced which have improved performance characteristics and controllability. Also, the present invention advantageously provides matched complementary semiconductor devices in which up-diffused regions having retrograded impurity concentration profiles form the collector regions for the transistors of one polarity type to produce self-isolating capability, and up-diffused regions having retrograded impurity concentration profiles circumscribe the collector regions for transistors of opposite polarity type for electrically isolating such transistors from other circuit components. Accordingly, the present invention advantageously provides a monolithic integrated circuit having matched complementary semiconductor devices that is substantially simple in design and relatively inexpensive to manufacture.

The terms and expressions which have been employed here and are used as terms of description and not limitation and it is not intended, in the use of such terms and expressions, to exclude any equivalence of the feature shown and described, or portion thereof, but it is recognized that various modifications are possible within the scope of the present invention.

Without further elaboration, the foregoing is considered to explain the character of the present invention so others may by applying current knowledge, readily adapt the same for use under varying conditions of service, while still retaining certain features which may properly be said to constitute the essential items of novelty involved, which items are intended to be defined and secured by the appended claims.

What is claimed is:

1. A monolithic integrated circuit including a substrate of one conductivity type and an epitaxial layer thereon of opposite conductivity type, said circuit having matched complementary transistors comprising in combination:
   a. transistor of one polarity type having a substantially completely retrograded impurity concentration profile throughout its collector region, extending from said substrate through said epitaxial layer; and
   b. an isolation region extending from said substrate through said epitaxial layer, having an impurity concentration profile substantially completely retrograded throughout, circumscribing a transistor of opposite polarity type; wherein
   c. said one polarity type transistor is self-isolating and said opposite polarity type transistor is isolated by said retrograded isolation region.

2. The monolithic integrated circuit of claim 1, including first and second buried regions of opposite conductivity type, wherein:
   a. said first buried region underlies and is contiguous with said retrograded collector region; and wherein
   b. said second buried region is spaced from and circumscribed by said retrograded isolation region; and wherein
   c. said retrograded collector region and said retrograded isolation region being of said one conductivity type.

3. A monolithic integrated circuit having matched complementary transistors, comprising in combination:
   a. a substrate of one conductivity type having first and second diffused regions of opposite conductivity formed therein;
   b. an epitaxial layer overlying one surface of said substrate and said regions;
   c. a transistor of one polarity type overlying said first region and having a substantially completely retrograded impurity concentration profile collector region, said retrograded collector region extending from said first region through said epitaxial layer;
   d. a transistor of opposite polarity type overlying said second region; and
   e. a substantially completely retrograded impurity concentration profile isolation region circumscribing said second region and bounding the collector region of said opposite polarity type transistor; wherein
   f. said first region and said epitaxial layer electrically isolate said one polarity type transistor and said retrograded isolation region electrically isolates said opposite polarity type transistor.

4. The monolithic integrated circuit of claim 3, wherein:
   a. said one and opposite conductivity types are respectively P and N types; and wherein
   b. said one and opposite polarity type transistors respectively are PNP and NPN types.

5. The monolithic integrated circuit of claim 3, wherein:
   a. said retrograded collector region has a maximum impurity concentration along its surface contiguous with said first region and a minimum impurity concentration along its outer surface; and wherein
   b. said retrograded isolation region has a maximum impurity concentration along its surface contiguous with said substrate and a minimum impurity concentration along its outer surface.

6. The monolithic integrated circuit of claim 3, wherein:
   a. said substrate is p-type silicon having a resistivity of about 10–15 ohm-centimeters and said epitaxial layer is n-type silicon having a resistivity of about 0.2 ohm-centimeters; and wherein b. said first and second regions are doped with antimony to a surface impurity concentration of about $1 \times 10^{18}$ atoms/cc; and wherein c. said retrograded collector region and said retrograded isolation region are each doped with boron to a surface impurity concentration of about $2 \times 10^{17}$ atoms/cc.

7. The monolithic integrated circuit of claim 6, wherein a. said one polarity type transistor has a base region doped with phosphorous to a surface impurity concentration about $1 \times 10^{19}$ atoms/cc, and an emitter region doped with boron to a surface impurity concentration of about $4 \times 10^{20}$ atoms/cc; and wherein b. said opposite polarity type transistor has a base region doped with boron to a surface impurity concentration of about $8 \times 10^{18}$ atoms/cc; and an emitter region doped with phosphorous, to a surface impurity concentration of $1 \times 10^{21}$ atoms/cc.

8. A monolithic integrated circuit having matched complementary transistors, comprising in combination:

a. a semiconductor substrate of one conductivity type having an epitaxial layer of material of opposite conductivity type formed thereover;

b. a plurality of spaced diffused buried regions of said opposite conductivity type formed substantially within said substrate;

c. a first transistor of one polarity type having:
1. an up-diffused collector region extending from a first buried region up and through said epitaxial layer, said collector region having a substantially completely retrograded impurity concentration profile in said epitaxial layer with a maximum impurity concentration along its surface that is contiguous with said first buried region and a minimum impurity concentration along its outer surface,
2. a diffused base region formed within said retrograded collector region, and
3. a diffused emitter region formed within said base region;

d. an up-diffused isolation region circumscribing a second buried layer and extending from said substrate up and through said epitaxial layer, said isolation region having a substantially completely retrograded impurity concentration profile in said epitaxial layer with a maximum impurity concentration along its surface that is contiguous with said substrate and a minimum impurity concentration along is outer surface; and e. a second transistor of opposite polarity type having:
1. a diffused base region overlying but spaced from said second buried region,
2. a diffused emitter region formed within said base region, wherein
3. the portion of said epitaxial layer circumscribed by said retrograded isolation region is the collector region of said second transistor; whereby f. said first transistor is self-isolating and said second transistor is electrically isolated by said retrograded isolation region.

9. A process for fabricating a monolithic integrated circuit having matched complementary transistors, comprising the following steps:

a. diffusing into a substrate of one conductivity type first and second regions of opposite conductivity type;

b. depositing an impurity concentration into said first region to form a third region of said one conductivity type;

c. depositing an impurity concentration into said substrate to form a fourth region of said one conductivity type circumscribing said second region;

d. epitaxially forming a layer of material of said opposite conductivity type over said substrate and said regions;

e. up-diffusing said third and fourth regions substantially through said epitaxial layer to form the collector region of one of said transistors of one polarity type having a substantially completely retrograded impurity concentration profile extending from said first region substantially through said epitaxial layer, and to form a sixth region having a substantially completely retrograded impurity concentration profile extending from said substrate substantially through said epitaxial layer, said sixth region circumscribing said second region and defining the collector region of the other of said transistors of opposite polarity type;

f. diffusing a base region of said opposite conductivity type in said retrograded collector region of said one polarity type transistor;

g. diffusing a base region of said one conductivity type in said collector region of said opposite polarity type transistor;

h. diffusing an emitter region of said one conductivity type into said base region of said one polarity type transistor; and i. diffusing an emitter region of said opposite conductivity type into said base region of said opposite polarity type transistor.

10. The process for fabricating a monolithic integrated circuit in accordance with claim 9, wherein:

a. said one and opposite conductivity types are respectively P and N types; and wherein b. said one and opposite polarity type transistors are respectively PNP and NPN types.

11. The process for fabricating a monolithic integrated circuit in accordance with claim 10, wherein:

a. said substrate is p-type silicon having a resistivity of about 10-15 ohm-centimeters and said epitaxial layer is n-type silicon having a resistivity of about 0.2 ohm-centimeters; and wherein b. said first and second regions are doped with antimony to a surface impurity concentration of about $1 \times 10^{18}$ atoms/cc; and wherein c. said retrograded collector region and said retrograded isolation region are each doped with boron to a surface impurity concentration of about $2 \times 10^{17}$ atoms/cc.

12. The process for fabricating a monolithic integrated circuit in accordance with claim 11, wherein a. said PNP transistor has a base region doped with phosphorus to a surface impurity concentration of about $1 \times 10^{19}$ atoms/cc, and an emitter region doped with boron to a surface impurity concentration of about $4 \times 10^{20}$ atoms/cc; and wherein b. said NPN transistor has a base region doped with boron to a surface impurity concentration of about $8 \times 10^{18}$ atoms/cc, and an emitter region doped with phosphorous to a surface impurity concentration of about $1 \times 10^{21}$ atoms/cc.

13. A monolithic integrated circuit having matched complementary transistors comprising in combination:
 a. a transistor of one polarity type having a substantially completely retrograded impurity concentration profile throughout its collector region; and
 b. a isolation region having an impurity concentration profile substantially completely retrograded throughout circumscribing a transistor of opposite polarity type; wherein
 c. said one polarity type transistor is self-isolating and said opposite polarity type transistor is isolated by said retrograded isolation region.

14. The monolithic integrated circuit of claim 13, wherein said one polarity type transistor is PNP and said opposite polarity type transistor is NPN.

* * * * *